(12) United States Patent
Jones et al.

(10) Patent No.: US 8,937,823 B2
(45) Date of Patent: Jan. 20, 2015

(54) CIRCUIT AND METHOD FOR PROTECTING A CONTROLLABLE POWER SWITCH

(75) Inventors: Rodney Jones, Stoke on Trent (GB); Jan Sundvall, Svenstrup (DK)

(73) Assignee: Siemens Aktiengesellschaft, München (DE)

( * ) Notice: Subject to any disclaimer, the term of this patent is extended or adjusted under 35 U.S.C. 154(b) by 150 days.

(21) Appl. No.: 13/639,244

(22) PCT Filed: Nov. 22, 2010

(86) PCT No.: PCT/EP2010/067944
§ 371 (c)(1),
(2), (4) Date: Oct. 4, 2012

(87) PCT Pub. No.: WO2011/124279
PCT Pub. Date: Oct. 13, 2011

(65) Prior Publication Data
US 2013/0033909 A1     Feb. 7, 2013

(30) Foreign Application Priority Data
Apr. 8, 2010   (EP) .................................. 10159370

(51) Int. Cl.
*H02H 7/122*     (2006.01)
*H03K 17/0812*   (2006.01)

(52) U.S. Cl.
CPC .................................. *H03K 17/0812* (2013.01)
USPC ........................................ 363/56.02; 361/18

(58) Field of Classification Search
CPC ...................................... H02M 7/122
USPC ..................... 361/18, 56, 88, 91.1–91.8, 111; 363/56.01–56.1
See application file for complete search history.

(56) References Cited

U.S. PATENT DOCUMENTS

| | | | | |
|---|---|---|---|---|
| 5,162,966 A | * | 11/1992 | Fujihira | 257/140 |
| 5,400,202 A | * | 3/1995 | Metz et al. | 361/56 |
| 5,424,892 A | * | 6/1995 | Topp et al. | 361/18 |
| 6,087,877 A | * | 7/2000 | Gonda et al. | 327/309 |
| 6,700,164 B1 | * | 3/2004 | Brennan et al. | 257/379 |
| 6,744,612 B2 | * | 6/2004 | Chen | 361/58 |
| 6,909,149 B2 | * | 6/2005 | Russ et al. | 257/355 |
| 7,154,725 B2 | * | 12/2006 | Chloupek et al. | 361/91.6 |
| 7,450,357 B2 | * | 11/2008 | Chen | 361/56 |
| 7,538,998 B2 | * | 5/2009 | Tsai et al. | 361/56 |

(Continued)

FOREIGN PATENT DOCUMENTS

| | | |
|---|---|---|
| CN | 1427519 A | 7/2003 |
| DE | 4428675 A1 | 2/1996 |

(Continued)

*Primary Examiner* — Timothy J Dole
*Assistant Examiner* — Yusef Ahmed (57) ABSTRACT

A circuit for protecting a controllable power switch is provided. The controllable power switch has a first power switch terminal connected to a first terminal, a second power switch terminal connected to a second terminal, and a power switch control terminal. Further, the circuit includes a diode with a first diode terminal and a second diode terminal, and a controllable control switch having a first control switch terminal connected to the first diode terminal, a second control switch terminal, and a control switch control terminal. A signal applied to the power switch control terminal is based on a signal at the second control switch terminal. Further a method for protecting a controllable power switch is described.

12 Claims, 6 Drawing Sheets

(56) References Cited

U.S. PATENT DOCUMENTS

| | | | |
|---|---|---|---|
| 7,576,964 B2 * | 8/2009 | Nakahara | 361/91.1 |
| 8,077,440 B2 * | 12/2011 | Krabbenborg et al. | 361/56 |
| 8,130,481 B2 * | 3/2012 | Yang et al. | 361/56 |
| 8,169,252 B2 * | 5/2012 | Fahrenbruch et al. | 327/434 |
| 8,174,808 B2 * | 5/2012 | Nakahara | 361/84 |
| 8,270,133 B2 * | 9/2012 | Nakahara | 361/84 |
| 8,467,162 B2 * | 6/2013 | Wang et al. | 361/56 |
| 2004/0027756 A1 | 2/2004 | Hertrich et al. | |
| 2006/0250742 A1 * | 11/2006 | Fichera | 361/100 |
| 2007/0014064 A1 * | 1/2007 | Souma | 361/91.7 |
| 2008/0088994 A1 * | 4/2008 | Lai | 361/56 |
| 2009/0128973 A1 * | 5/2009 | Nakahara | 361/91.7 |
| 2009/0213507 A1 * | 8/2009 | Chen et al. | 361/56 |
| 2011/0235228 A1 * | 9/2011 | Salcedo et al. | 361/111 |
| 2012/0147634 A1 * | 6/2012 | Jones | 363/37 |

FOREIGN PATENT DOCUMENTS

| | | |
|---|---|---|
| DE | 19535129 A1 | 3/1997 |
| DE | 19927727 A1 | 12/1999 |
| EP | 0860947 A1 | 8/1998 |
| EP | 1653619 A1 | 5/2006 |

* cited by examiner

CIRCUIT AND METHOD FOR PROTECTING A CONTROLLABLE POWER SWITCH

CROSS REFERENCE TO RELATED APPLICATIONS

This application is the US National Stage of International Application No. PCT/EP2010/067944 filed Nov. 22, 2012, and claims the benefit thereof. The International Application claims the benefits of European Patent Application No. 10159370.5 EP filed Apr. 8, 2010. All of the applications are incorporated by reference herein in their entirety.

FIELD OF INVENTION

The present invention relates to a circuit and to a method for protecting a controllable power switch, and particularly a power switch comprised in a converter module section for converting a DC voltage to an AC voltage. Further, the present invention relates to a converter module for converting a DC voltage to an AC voltage, in particular to be used in an electrical power production plant, such as a wind turbine farm.

ART BACKGROUND

For providing electric energy to an utility grid an electrical power production plant may comprise one or more converter modules (also called inverter modules) for converting a variable frequency power signal (or voltage or current) to a fixed frequency (e.g. 50 Hz or 60 Hz) AC signal (or voltage or current). In a typical converter module the variable frequency AC power signal may first be converted to a DC signal (or voltage or current) using a number of power transistors. Further, the DC signal (or voltage or current) may subsequently be converted to a fixed frequency AC signal (or voltage or current) using one or more (in particular six for a two level three phase inverter) power transistors—see what FIG. 6 for a basic example.

The power transistors connected to the DC signal (or voltage or current) (also called DC-link) may be controlled regarding their conductivity by corresponding control circuits in order to deliver a three phase AC signal (or voltage or current) at three output terminals of the converter module. In particular, the converter module may be implemented as an electrical semiconductor power conversion unit.

It may be known that power semiconductors in power conversion units are exposed to induced over-voltages during turn off transitions. Notice that this phenomenon may not be limited to the inverter topology shown in FIG. 6, but it may be a generally recognized problem in the field of switching converters, due to unavoidable impedance in the switching power circuit.

The essence of the problem may be that to switch-off a power semi-conductor device may generate through the leakage inductance of the inverter power circuit a transient over-voltage in the micro-second to sub-microsecond time domain. This overvoltage, if not controlled, may lead to breakdown of the power semi-conductor device which can then lead to catastrophic failure of the power semi-conductor device. Techniques to control this power semi-conductor switch-off related over-voltage include the use of Zener or transil type diodes connected between (say) the collector and gate of (for example) an IGBT device (as an example of a power semi-conductor device).

Then looking to the application conditions of the power semiconductor device in the inverter module (or particularly the active rectifier mode of operation of the inverter module), if the power flow and associated current from inductively fed ac terminals is terminated, then to bring the current to zero in the feeding inductors connected to the ac terminals of the inverter (operating in active rectifier mode) (for example the leakage inductance of a permanent magnet generator in the example of a direct drive wind turbine) then sufficient volt seconds have to be applied to the leakage inductance (reset voltseconds as per text book descriptions). All the time that the reset is taking place, energy is being transferred from the leakage inductance to the DC link circuit of the inverter operating in active rectification mode. Further energy is also received from the shaft of the generator (and before that the blades of the turbine and the wind) which is a function of the back-emf (electromagnetic force) of the generator during the reset period and the generator current waveform during the reset period. In a typical scheme, the time to reset the current in the leakage inductance of the generator to zero will be in the order of 10 ms-20 ms, and a significant amount of energy is transferred from the generator to the DC link during this event.

If, in a typical wind turbine power converter, the DC link is connected to a network inverter to further process the power received from the permanent magnet generator and transfer this to the power network or power grid, then the DC link voltage does not rise significantly, except for the initial say 1 μs voltage spike associated with the turn-off of the power semi-conductor device.

However, if the reason for turning off the power semiconductor devices of the generator bridge are due to the non-availability of the network as a receiver of this energy, then the energy received from the generator during the turn-off event (resetting in the generator leakage inductance current to zero) may charge up the DC link capacitance. Depending on the dimensioning of the DC link capacitance, the ultimate DC link voltage may significantly exceed the operational threshold of the Zener or transil clamp network necessary to control the overvoltage during the turn-off of the power semi-conductor device. If a countermeasure was not included, then the Zener or transil clamp network would result in the catastrophic damage being caused to the entire inverter system as the Zener or transil clamp network would force the power semi-conductors into a conductive state and expose the power semi-conductor devices to energy far in excess of their dissipation capability.

In particular, direct drive permanent magnet generators may generally feature high leakage inductance compared to equally rated induction machines. During certain fault scenarios the amount of energy stored in that leakage inductance may become very high due to very high currents. When this energy is subsequently transferred to the DC link capacitors (which may represent energy storage elements), the DC link voltage may rise to a high level. In certain worst case scenarios the DC link voltage may rise significantly above the clamping level and finally the clamping scheme becomes a threat rather than a protection mechanism, because the semiconductors will then dissipate energy in excess of their capability and may be damaged.

Thus, over-voltages occurring in particular at a DC link of a converter module may be harmful for components, in particular power transistors, comprised in the converter module. Thereby, the power transistors, or generally controllable switches, may be destroyed due to the over voltage.

To manage this problem, the conditional active clamp circuit of this invention is described.

There may be a need for a circuit and for a method for protecting a controllable power switch, in particular a power transistor, which is connected between terminals to which a voltage is applicable. Further, there may be a need for a circuit and a method for protecting a controllable power switch which enables protection of the controllable power switch and clamping of the voltage between terminals of the power switch. Further, there may be a need for a circuit and a method for protecting a controllable power switch, wherein voltage clamping may be performed more effectively.

SUMMARY OF THE INVENTION

This need may be met by the subject matter according to the independent claims. Advantageous embodiments of the present invention are described by the dependent claims.

According to an embodiment a circuit for protecting a controllable power switch (in particular a transistor, in particular a power transistor, e.g. an isolated gate bipolar transistor (IGBT) or equivalent power semiconductor switch, a bipolar junction transistor, or a MOSFET) connected between a first terminal of the circuit and a second terminal of the circuit from over-voltage (in particular DC over-voltage, such as a over-voltage, which depending on the application could reach several kV, applicable between the first terminal of the circuit and the second terminal of the circuit. The circuit comprises the controllable power switch (e.g. a semiconductor power switch, a power transistor, an IGBT, a bipolar junction transistor, or a MOSFET) having a first power switch terminal (such as a drain or a collector) connected to the first terminal of the circuit, a second power switch terminal (such as a source or an emitter) connected to the second terminal of the circuit, and a power switch control terminal (such as a gate terminal), wherein a conducting state between the first power switch terminal and the second power switch terminal (in particular represented by the possibility of current flow through the controllable power switch from the first power switch terminal to the second power switch terminal) is based on a voltage applied between the power switch control terminal and the second power switch terminal; a diode (e.g. a semiconductor electrical component, in particular a Zener-diode or a transil diode) having a first diode terminal (such as an anode) and a second diode terminal (such as a cathode), the diode allowing electric current flow between the first diode terminal and the second diode terminal in a forward direction and allowing electric current flow in a reverse direction opposite to the forward direction, when a voltage applied between the second diode terminal and the first diode terminal is above a diode threshold voltage (also referred to as breakdown voltage, when the diode is a Zener-diode), the second diode terminal being connected to the first terminal. Further, the circuit comprises a controllable control switch (e.g. a semiconductor device, such as a transistor, e.g. a bipolar junction transistor, a MOSFET, an IGBT or the like) having a first control switch terminal (such as a drain or a collector) connected to the first diode terminal, having a second control switch terminal (such as a source or an emitter), and a control switch control terminal (such as a gate terminal of the control switch), wherein a conducting state between the first control switch terminal and the second control switch terminal is based on a voltage applied between the control switch control terminal and the second control switch terminal, wherein a signal applied to the power switch control terminal is based on a signal at the second control switch terminal.

Zener diodes in general are low voltage devices which are characterized by the Zener effect. Transil diodes operate similar to Zener diodes, with a well defined "knee" point when reverse biased. But the clamping mechanism is different—called avalanche effect. Transils are usually the choice for high voltage applications due to their ability to dissipate high peak power.

The protection circuit may also work with a bi-directional transil or transils which have characteristics similar to a back to back series connected Zener diode (equivalent to terminal one being connected to terminal one of each Zener diode). The bidirectional transil such as a ST type SMCJxxCA-TR is a representative type.

The controllable power switch is intended to be protected against over-voltage applied between the first power switch terminal and the second power switch terminal. The controllable power switch may e.g. a component of (a section of) a converter module, in particular for converting a DC signal (or voltage or current) to a fixed frequency AC signal (or voltage or current). The controllable power switch may in particular be an IGBT, a MOSFET or a bipolar junction transistor or the like. In particular, a voltage applied between the power switch control terminal (such as a gate) and the second power switch terminal (such as an emitter) may determine whether the controllable power switch is in a conducting state (conducting current from the first power switch terminal to the second power switch terminal) or in a non-conducting state (where no current is allowed to flow from the first power switch terminal to the second power switch terminal).

The diode may in particular be a Zener-diode that permits current not only in the forward direction like a normal diode but also in the reverse direction, if the voltage applied at the diode terminals is larger than the breakdown voltage also known as "Zener knee voltage" or "Zener voltage" (which may be used as a synonym for the term "diode threshold voltage"). When a positive voltage is applied between the first terminal and the second terminal of the circuit (the electric potential applied at the first terminal is higher than the electric potential applied at the second terminal) the diode is connected such that it allows current flow in the reverse direction, when the voltage applied between the first terminal and the second terminal is above the diode threshold voltage. Thereby, the diode threshold voltage may be adjusted such that it is slightly lower than a maximum voltage applicable (or tolerable) at the controllable power switch without destroying the controllable power switch.

When the voltage applied between the first terminal and the second terminal is above the diode threshold voltage the diode becomes conductive in the reverse direction. However, even in this case, the current flowing in the reverse direction through the diode is controlled by the controllable control switch (in particular connected in series with the diode). Thereby, the clamping function (performed by the diode) is controllable and/or conditional. In particular, in certain conversion units the active clamping function may be required to manage the over-voltage immediately at the point of turn-off of the IGBT (the controllable power switch) or an equivalent power semiconductor switch, but still at the same time be at risk should a subsequent DC-link over-voltage exist. To avoid destruction of the semiconductors (in particular the controllable power switch) the active clamp is provided to be controllable and/or conditional. In particular, the conventional active clamp (represented by the Zener diode) is extended by a series mode switch (the controllable control switch) which may be turned on and off by convenience using a further control circuit, so to enable or disable the switch and clamp function (which is provided in a conventional circuit by the diode alone).

For controlling the function of the diode the first diode terminal (which is in particular not connected to the first power switch control terminal of the circuit) is connected to the first control switch terminal. Thereby, current will flow through the diode in the reverse direction, only if the controllable control switch is in a conducting state. Further, the conducting state of the controllable control switch may be controlled by a control switch driver circuit, as explained below.

The signal applied to the power switch control terminal (which controls the state (conducting or non-conducting) of the controllable power switch) is primarily based on the state defined by the gate drive input pin—see the figures.

However—when the gate driver switches into off state (because of the input signal switches to off state), the state of the IGBT may still be overruled and set into on state for a short while by current conducted into the gate by the transil and the control switch, until the clamp control turns the control switch off. This happens if and when Vce rises shortly as shown in the wave forms FIG. 2, as is explained below.

The main control is to the power switch control terminal, the conditional active clamping control for the second switch (the switch in series with the Zener or transil diode) may be derived from the main control signal, but extended (or delayed) by sufficient time so that the active clamping circuit remains functional until say 10 μs after the turn-off of the main power switch (by the clamp control circuit).

In particular, active clamping may not be needed continuously but may only be needed in a limited duration of time, i.e. in the normal on-state to off-state transitions and in the whole on-state (of the controllable power switch). In the largest portion of the off-state of the controllable power switch active clamping may not be needed. Thus, using the controllable control switch active clamping may be turned off during these time durations by correspondingly controlling the controllable control switch. In particular, during the on-state of the controllable power switch (where the controllable power switch is conducting or is in a conducting state) the clamp including the controllable control switch and the diode may be designed to operate and stay active in these states. In the remaining off-state (of the controllable power switch) the clamp may then be required to ignore any collector emitter voltages increasing above the clamp level.

According to an embodiment the circuit further comprises a gate driver circuit having one reference terminal (local ground=for an IGBT the emitter) connected to the second power switch terminal and having a gate driver output terminal connected to the power switch control terminal, wherein a signal generated at the gate driver output terminal is based on a signal applied to the gate driver input terminal.

Further, the signal at the gate driver output terminal may further be based on an external control signal, such as a gate driver input signal or a sense input signal. In particular, the gate driver circuit may be adapted to generate an output signal based on the external signal and based on the signal at the second power switch terminal (the connection between the second power switch terminal and the gate driver is not a signal path—it is the reference for the whole circuit=local ground) to generate a voltage between the gate driver output terminal and the second control switch terminal based on the external signal.

Thereby, it is enabled to control the controllable power switch to assume a conducting state or a non-conducting state such that the circuit may eventually be used within a converter module for converting a variable frequency signal to a fixed frequency signal.

According to an embodiment the circuit further comprises a control switch driver circuit having a control switch driver output terminal connected to the control switch control terminal and having a control switch driver input terminal connected to the gate driver output terminal, wherein the control switch driver circuit is adapted to generate a signal at the control switch driver output terminal based on a signal received at the control switch driver input terminal. Thereby, it is enabled to control the state (conducting or non-conducting) of the controllable control switch. In particular, the control switch driver circuit may be controlled by the gate driver circuit, in particular a signal applied at the gate driver output terminal. Thus, the behaviour (conducting state or non-conducting state) of the controllable control switch may be synchronized or at least partially based on a behavior of the controllable power switch (which is at least partly controlled by the gate driver circuit output). Thus, it is enabled to switch on and off the clamping function provided by the diode and the controllable control switch. Thereby, protecting the controllable power switch may be performed more efficiently. The correct controlling of the controllable control switch may be obtained by the control switch driver circuit (also referred to as clamp control). In fact the timer circuit may be required to ensure that the clamp (comprising the diode and the controllable control switch) is disabled after say 10 μs after the device (the controllable power switch) is turned off, so to ensure that any short duration over-voltage spikes are clamped.

According to an embodiment the second control switch terminal is connected (in particular directly electrically connected) to the power switch control terminal. Thereby, when the voltage applied between the first terminal and the second terminal of the circuit is above the diode threshold voltage and when the controllable control switch is in the conducting state the over-voltage signal is applied at the power switch control terminal to switch the power switch into a conducting state, in order to discharge or dissipate the energy related to the over-voltage. In other embodiments the second control switch terminal is not (directly) connected to the power switch control terminal.

According to an embodiment the gate driver circuit has a further gate driver input terminal (also referred to as an optional sense input, wherein the signal generated at the gate driver output terminal is further based on a signal applied to the further gate driver input terminal, wherein the further gate driver input terminal is connected to the second control switch terminal. There exist a number of modern commercial integrated gate driver circuits providing this functionality to have a further input terminal. This may be used in conjunction with the basic active clamping circuit and may provide a direct link to control and bring the gate drive output stage into either high impedance state or into on state during the clamping operation. Thus, when the controllable control switch is in a conducting state, a signal will be applied to the further gate driver input terminal which allows taking into account the signal at the second control switch terminal for controlling the gate of the controllable power switch. In particular, during a conventional clamping method the gate driver output signal may be in an off-state and this may actually oppose the active clamp to attempt to turn on the controllable power switch, because the gate driver circuit tries to sustain the off-state in the conventional circuit. However, using the further gate driver input terminal the gate driver output signal may be turned on in response to a need for clamping or brought into high impedance state for improved clamping performance. Fortunately, the gate driver circuit and the IGBT are separated (decoupled) by a low ohmic resistance, so the clamping action using just the transil (diode) network connected to the gate is still possible, even though a significant part of the clamping current flows into the gate driver, thus reducing the active clamping effect, which is not desirable.

When it is enabled that the gate driver output signal causes the controllable power switch to switch into a conducting state in response to a need for clamping, the active clamping action may be improved, because then both the diode and the gate driver output signal seeks the same state (conducting state of the power switch) instead of opposing each other (as in the conventional case). Alternatively the output may be brought into high impedance state for even better performance, because then the gate emitter voltage will not become limited and may rise up above the gate emitter on state voltage as defined by the gate driver circuitry.

Yet another advantage may be that the transils (diode) power dissipation may be decreased, when the gate driver output stage forces the power semiconductor (controllable power switch) on through the direct route. Usually, the peak dissipation in the Zener diodes peaks in the kW range (in the ps domain) and during continuous long-term active clamping the diodes may suffer from thermal effects and have to be diminished accordingly. By using the amplifier stage in the gate driver output circuit either as part of the active clamping function actively, or by disconnecting it, reduced dissipation of the transils (diodes) may be achieved with the corresponding reduction in their size and cost.

According to an embodiment the circuit further comprises a further controllable control switch (such as a semiconductor device, such as a transistor, e.g. a bipolar junction transistor, a MOSFET, an IGBT or the like) having a first further control switch terminal (such as a drain or a collector), a second further control switch terminal (such as a source or an emitter) and a further control switch control terminal (such as a gate), wherein a conducting state between the first further control switch terminal and the second further control switch terminal is based on a voltage applied between the further control switch control terminal and the second further control switch terminal, wherein the gate driver circuit has a further gate driver (sense) input terminal, wherein the second further control switch terminal is connected to the further gate driver (sense) input terminal and wherein the further control switch control terminal is connected to a further control switch driver output terminal of the control switch driver circuit.

The further controllable control switch may provide a signal to be provided to the further gate driver (sense) input terminal synchronously with the signal supplied to the power switch control terminal. Thereby, a higher flexibility is enabled. In particular, the circuit complexity may depend highly on whether the further gate driver (sense) input terminal is low or high impedance seen from the outside. In the case the sense pin is low impedance, the second further control switch terminal may be permanently connected to the sense pin. The input impedance is normally rather low, when looking into a current source rather than a voltage measurement circuit.

Alternatively, the further gate driver input terminal may be high impedance, wherein the control switch driver circuit (also referred to as clamp control) may be a floating circuit (having a local ground, independent from the emitter referenced local ground) that maintains the gate source voltage at a correct level, no matter how the surrounding circuitry may move regarding potential during clamping activity.

In particular, the control switch is in a non-conducting state, when no clamping is needed. The overall advantage with the controllable active clamping is that during power switch off state, the DC link voltage may rise up above normal clamping level without having the active clamp trying to limit the voltage. One may allow the clamp to stay off during permanent off state, because in the off state no conditions can occur that would require active clamping. Off state in this respect refers to the conditions in the (example) IGBT where the current in the IGBT is zero.

According to an embodiment the signal generated at the control switch driver output terminal is such that the control switch is in the conducting state for the whole on-state plus an additional time interval between e.g. 500 ns and 30 µs into the off state, depending on the application and electrical characteristics.

What is important is that the additional time interval is sufficient large in all circumstances to allow the main switch to completely turn-off the collector current and sufficiently short that the control switch and so the active clamp function it is controlling is off before the DC link may rise above the conduction threshold for the Zener diode or transil network as a result of current from the generator.

According to an embodiment the circuit is adapted to generate a signal at the gate driver output terminal such that the power switch is in the conducting state, when the voltage applied between the second diode terminal and the first diode terminal is above the diode threshold voltage. Thereby, the over-voltage may be discharged using both the diode and the controllable power switch to improve the clamping function.

According to an embodiment the circuit further comprises a current limiting resistor connected between the gate driver output terminal and the second control switch terminal, to limit a current flowing from the gate driver output terminal and into the IGBT gate. It is true that it also limits the current flowing backwards into the driver, but this is not the main objective. Basically any reverse current is undesired, as it reduces the clamp performance. In particular, the current may be limited in the case where the voltage between the first terminal and the second terminal is above the diode threshold terminal and at the same time when the controllable control switch is in a conducting state. Thereby, it may be effected that most of the current flows into the power switch control terminal instead of flowing into the gate driver circuit.

According to an embodiment the circuit further comprises a resistor connected between the first diode terminal and the second power switch terminal (in particular directly connected) for protecting the controllable control switch from an over-voltage during very high DC link voltage conditions, where the control switch is in non-conducting state.

According to an embodiment a converter module (or at least one section of a converter module) (in particular to be used within an energy production plant, such as a wind turbine park) for converting a DC voltage to an AC voltage (or for converting a variable frequency AC voltage to a fixed frequency AC voltage) is provided comprising at least one circuit for protecting a controllable power switch as described above. Herein, in particular, the controllable power switch may be one of a power switch comprised in the converter module downstream of a DC-link. In particular, a voltage applied at the DC-link may be applied between the first terminal and the second terminal of the circuit. In particular, the circuit may protect the controllable power switch from over-voltages occurring at the DC-link. In particular, the converter module may be used to convert a power signal provided from a wind turbine park typically being a variable frequency AC power signal.

According to an embodiment a method for protecting a controllable power switch connected between a first terminal and a second terminal from over-voltage applied between the first terminal and the second terminal is provided, wherein the method comprises applying a voltage between the control terminal and the second terminal; controlling a conducting state between a first power switch terminal of the power switch and a second power switch terminal of the power switch based on a voltage between a power switch control terminal and the second power switch terminal, wherein the first power switch terminal of the controllable power switch is connected to the first terminal and the second power switch terminal of the controllable switch is connected to the second terminal; allowing electric current flow between a first diode terminal of a diode and a second diode terminal of the diode in a forward direction; allowing electric current flow between the first diode terminal of the diode and the second diode terminal of the diode in a reverse direction opposite to the forward direction, when a voltage applied between the second diode terminal and the first diode terminal is above a diode threshold voltage, the second diode terminal being connected to the first terminal; controlling a conducting state between a first control switch terminal of a controllable control switch and a second control switch terminal of the controllable control switch based on a voltage applied between a control switch control terminal of the controllable switch and the second control switch terminal, the first control switch terminal being connected to the first diode terminal, wherein a signal applied to the power switch control terminal is based on a signal at the second control switch terminal.

It should be understood that features (individually or in any combination) described, disclosed or explained with respect to a circuit for protecting a controllable power switch may also be applied, provided or used for a method for protecting a controllable power switch.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

The techniques are applicable to any power conversion equipment including power semi-conductor devices where the switch-off overvoltage of the power semi-conductor has to be managed by for example an active clamping circuit whilst still allowing a system derived overvoltage to exist above the threshold of the active clamping circuit in the subsequent period.

Examples include ship propulsion, industrial drives, fuel cell converters, automotive drives and so on.

BRIEF DESCRIPTION OF THE DRAWINGS

Embodiments of the present invention are now described with reference to the accompanying drawings.

DETAILED DESCRIPTION

The illustration in the drawing is schematically. It is noted that in different figures, similar or identical elements are provided with the same reference signs or with reference signs, which are different from the corresponding reference signs only within the first digit.

Figure 1:
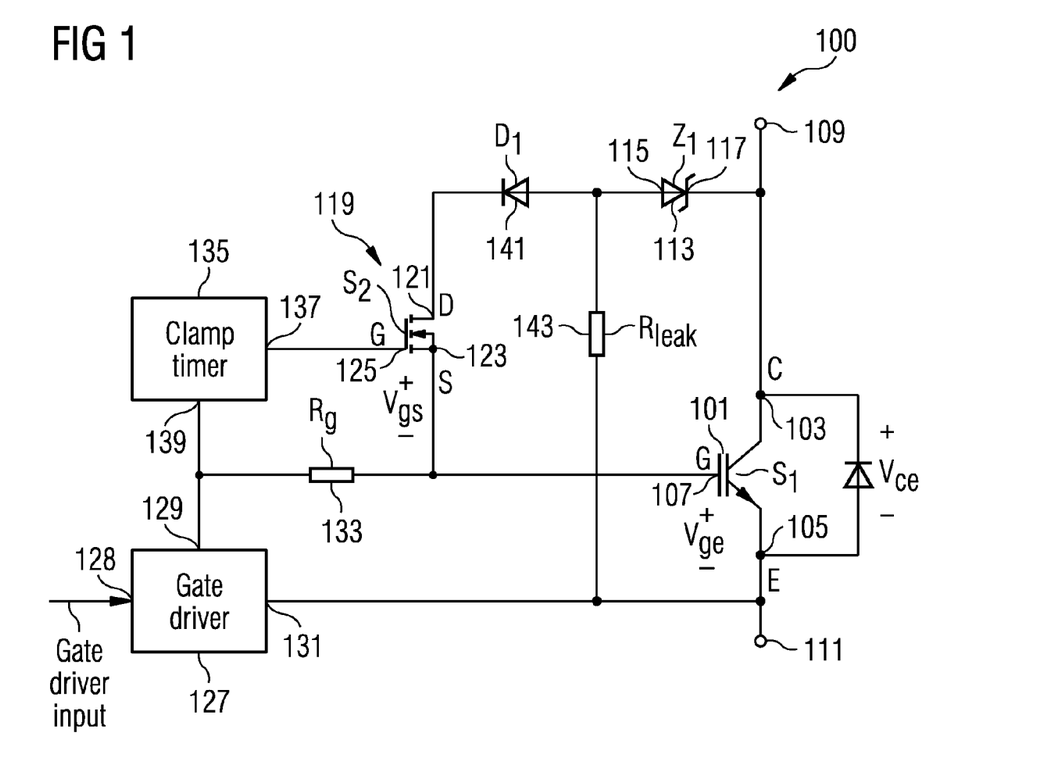
FIG. 1 illustrates a circuit diagram of a circuit for protecting a controllable power switch according to an embodiment.

FIG. 1 illustrates a circuit driver of a circuit 100 for protecting a controllable power switch according to an embodiment. The circuit 100 comprises the controllable power switch 101 which is here implemented as an IGBT having a first power switch terminal 103 (here implemented as a collector C), a second power switch terminal 105 (here implemented as emitter E) and a power switch control terminal 107 (here implemented as gate G). A conducting state of the controllable power switch 101 (also referred to as $S_1$) depends on a voltage $V_{ge}$ between the gate 107 and the emitter 105 of the controllable power switch 101. The circuit 100 further comprises a first terminal 109 and a second terminal 111 between which a voltage (typically a DC voltage, such as a DC voltage of a DC-link of a converter module) is applicable. In particular, at the first terminal 109 a higher potential may be applied than at the terminal 111.

The circuit 100 further comprises a diode 113 (also referred to as $Z_1$) which is in the present case implemented as a Zener-diode. The Zener-diode 113 has a first diode terminal 115 (the anode) and a second diode terminal 117 (the cathode). The forward flow direction of the diode 117 is from the anode 115 to the cathode 117, which is effected, if the potential applied at the anode 115 is higher than the potential applied at the cathode 117. However, in the case a positive voltage is applied between the first terminal 109 and the second terminal 111 (the potential applied at the first terminal 109 is higher than the potential applied at the second terminal 111) the diode 113 does not allow current flowing in the forward direction, i.e. from the anode 115 to the cathode 117. However, if the voltage applied between the first terminal 109 and the second terminal 111 (also referred as the DC-voltage) rises above the diode threshold voltage (or break-down voltage) of the Zener-diode 113, the diode 113 allows current flow in a reverse direction from the cathode 117 to the anode 115. This may in particular occur, if the DC-voltage is above a voltage maximum tolerable for the power switch 101. In this situation the diode 113 is part of a voltage clamp for reducing the over-voltage applied between the first terminal 109 and the second terminal 111, in order to protect the controllable power switch 101.

For providing a conditional and/or controllable clamping function the circuit 100 further comprises a controllable control switch 119 (also referred to as $S_2$) having a first control switch terminal 121 (here implemented as drain D), a second control switch terminal 123 (here implemented as source S) and a control switch control terminal 125 (here implemented as gate G). A conducting state of the controllable control switch 119 which is in the illustrated example implemented as a MOSFET, depends on a voltage $V_{gs}$ between the gate 125 and the source 123 of the controllable control switch 119.

For controlling a state of the controllable power switch 101 a gate driver circuit 127 is provided which has a gate driver output terminal 129 connected to the power switch control terminal 107. A gate driver reference terminal 131 is connected to the second power switch terminal 105, a gate driver input terminal 128 allows external control of the gate driver 127. Further, the power switch control terminal 107 is connected to the second control switch terminal 123. In order to reduce current flow from the second control switch terminal 123 into the gate driver output terminal 129 a limiting resistor 133 is connected between the second control switch terminal 123 and the gate driver output terminal 129.

For controlling a conduction state of the controllable control switch 119 a control switch driver circuit 135 is provided having a control switch driver output terminal 137 connected to the control switch control terminal 125. Further, a control switch driver input terminal 139 is connected to the gate driver output terminal 129. Further, a normal diode 141 (also referred to as $D_1$) is connected between the first diode terminal 115 and the first control switch terminal 121 in order to prohibit current flow from the first control switch terminal 121 to the first terminal 109. Further, to control an over-voltage applied at the controllable control switch 119 a resistor 143 is connected between the first diode terminal 115 and the second terminal 111.

Figure 2:
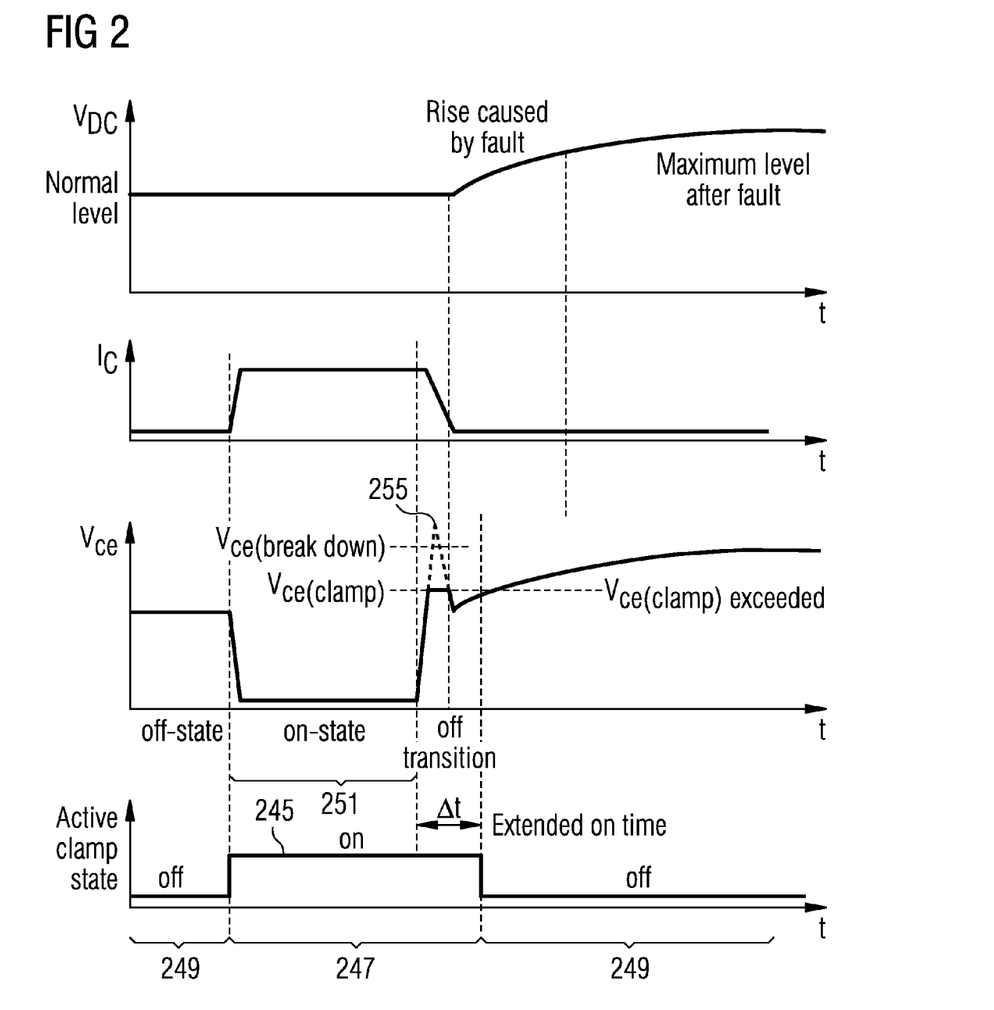
FIG. 2 illustrates graphs showing time courses of states of the controllable power switch and of states of the conditional active clamp.

FIG. 2 illustrates diagrams of an on and an off transition during normal operation followed by an increase in DC link voltage as consequence of the generator current(s) being reset to zero.

Figure 6:
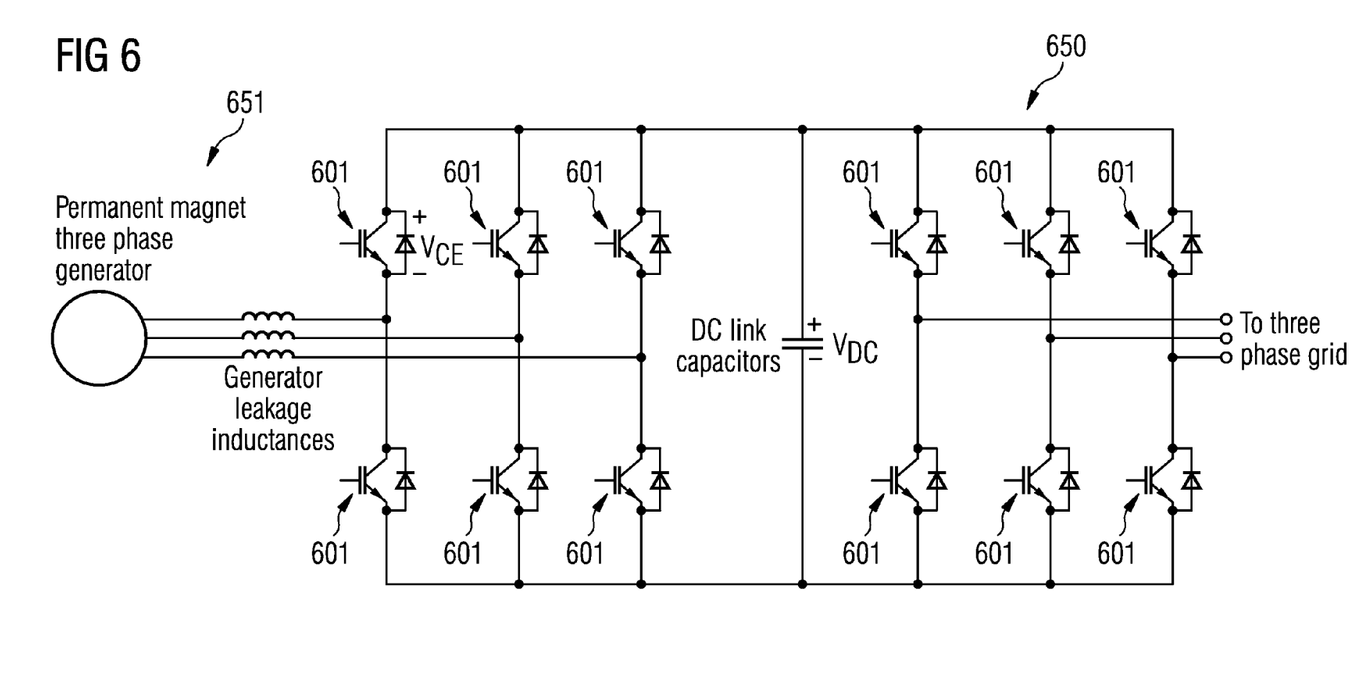
FIG. 6 illustrates an example of a basic three phase back to back converter configuration fed from a permanent magnet generator.

In all four diagrams on an abscissa the time t is indicated, on the ordinate in the first diagram the DC link voltage ($V_{DC}$, the voltage between the first power switch terminal 103 and the second power switch terminal 105), in the second diagram the Load current ($I_C$), in the third diagram the Collector emitter voltage ($V_{ce}$) and in the fourth diagram the Active clamp state is illustrated. The dotted part of the $V_{ce}$ off transition illustrates the potential voltage over shoot exceeding the break down level of the switching device, if no active clamping is applied. Nodes of VDC and VCE are shown in 6 also.

A state of the controllable power switch 101 is shown as a curve 245 and a time interval 247 in which the controllable control switch 119 is in a conducting state, thereby activating clamping.

The time periods 249 indicate time periods in which the controllable power switch 101 is in a non-conducting state such that the voltage between the first power switch terminal 103 and the second power switch terminal 105 is relatively high. In between the two off-states 249 a time period 251 representing an on-state of the controllable power switch 101 is located.

The controllable power switch 101 is in an extended conducting state for a time interval Δt after the controllable power switch has switched from a conducting state to a non-conducting state. After this time interval the controllable power switch 101 switches into a non-conducting state.

The on-state and the off-state (conducting state and non-conducting state, respectively) of the controllable power switch 101 may be controlled by the gate driver circuit 127 as well as by a signal applied at the second control switch terminal 123. In other embodiments the conducting state and the non-conducting state of the controllable power switch may be controlled without having the second control switch terminal 123 directly connected to the controllable control switch control terminal 107.

As can be seen from FIG. 2 the clamp active state 247 (representing a conducting state of the controllable control switch 119 illustrated in FIG. 1) completely covers and extends the on-state 251 of the controllable power switch 101. Thus, when an over-voltage exists between the first terminal 109 and the second terminal 111 this over-voltage may be discharged or reduced by current flow from the first terminal 109 via the Zener-diode 113, the normal diode 141, the controllable control switch 119 to the power switch control terminal 107 and partially also to the gate driver output terminal 129 (in fact undesired). Further, in a portion during the off-state 253 of the controllable power switch 101 the controllable control switch 119 is still in the conducting state, since especially in this transition region from an on-state to an off-state of the controllable power switch 101 a voltage spike, such as the spike 255, may occur. Since the clamp is in the active state during occurrence of the spike 255 (the controllable control switch 119 is in a conducting state) the spike 255 may effectively be degraded or reduced by current flow from the first terminal 109 to the power switch control terminal 107.

Figure 3:
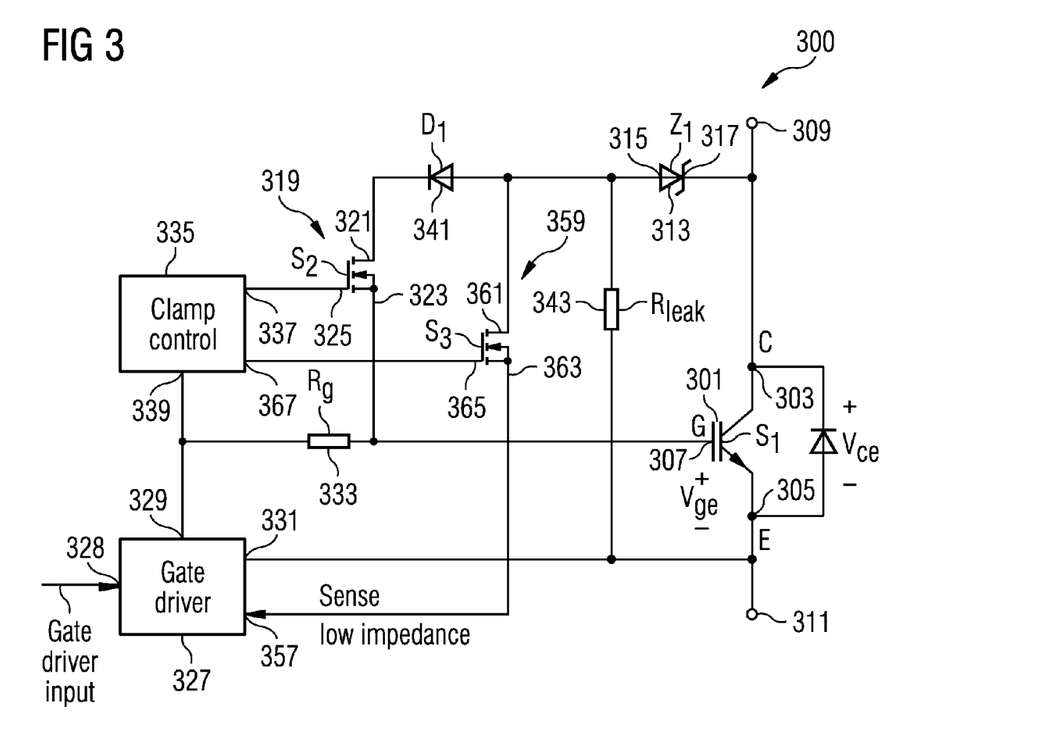
FIG. 3 illustrates a circuit diagram of a circuit for protecting a controllable power switch according to another embodiment.

FIG. 3 illustrates another embodiment 300 of a circuit for protecting a controllable power switch. The circuit 300 has similarities with the circuit 100 illustrated in FIG. 1, as it also comprises a controllable power switch 301, a first terminal 309, a second terminal 311, a Zener-diode 313, a controllable control switch 319, a gate driver circuit 327, a control switch driver circuit 335, a resistor 333, a normal diode 341, and a resistor 343 which have similar terminals as the corresponding components illustrated in FIG. 1 and which are connected in a similar way as in the embodiment illustrated in FIG. 1. Differing from the embodiment 100 of FIG. 1, the gate driver circuit 327 illustrated in FIG. 3 has a further gate driver input terminal 357. Further, the circuit 300 further comprises a further controllable control switch 359 (also referred to as $S_3$) having a first further control switch terminal 361, a second further control switch terminal 363 and a further control switch control terminal 365. Herein, the second further control switch terminal 363 is connected to the further gate driver input terminal 357. Further, the control switch driver circuit 335 comprises a further control switch driver output terminal 367 which is connected to the further control switch control terminal 365. In particular, the further gate driver input terminal 357 may be a low impedance input terminal.

Figure 4:
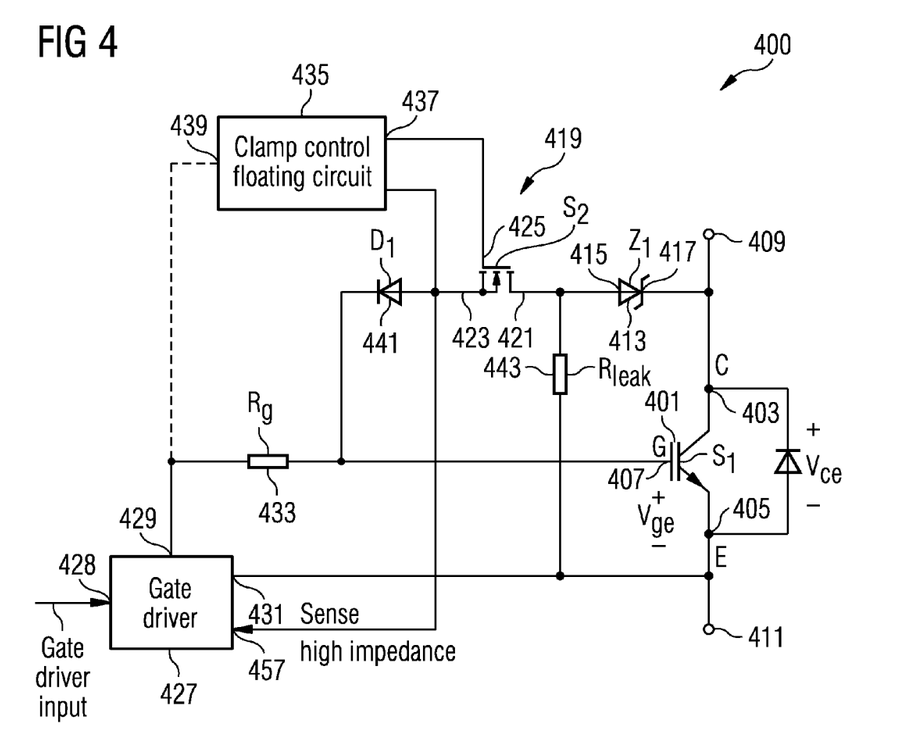
FIG. 4 illustrates a circuit diagram of a circuit for protecting a controllable power switch according to another embodiment.

FIG. 4 illustrates a block diagram of another embodiment 400 of a circuit for protecting a controllable power switch. The embodiment illustrated in FIG. 4 shows similarities to the embodiments illustrated in FIGS. 1 and 3 comprising components labeled with same reference numbers which differ only in the first digit. For understanding the function and structure of these components it is referred to the descriptions regarding FIGS. 1 or/and 3. In the circuit 400 the gate driver further input terminal 457 may be a high impedance input terminal and the control switch driver circuit 435 may be a "floating circuit" that maintains the gate source voltage of the control switch control terminal 425 at a correct level, no matter how the surrounding circuitry may move regarding potential during clamping activity.

The embodiment illustrated in FIG. 4 appears much simpler than the embodiments illustrated in FIG. 1 or 3, but the floating clamp controller may require magnetic components to obtain an independent power supply for this circuitry.

Therefore, the overall complexity may be likely to be increased compared to the embodiments illustrated in FIG. 1 or 3.

Figure 5:
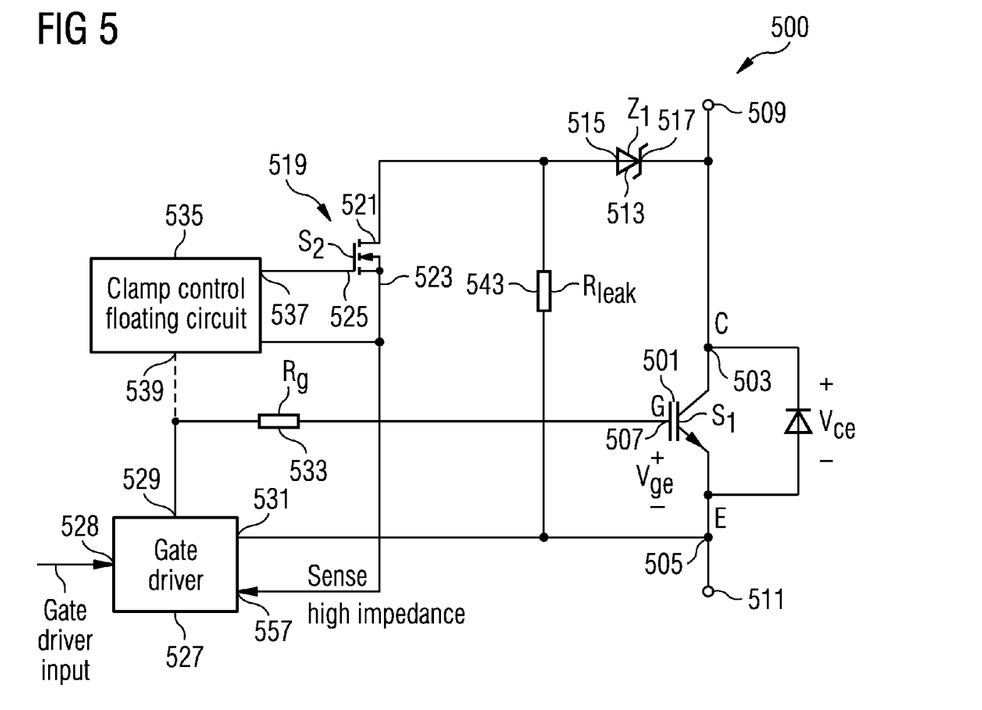
FIG. 5 illustrates a circuit diagram of a circuit for protecting a controllable power switch according to another embodiment.

FIG. 5 illustrates another embodiment 500 of a circuit for protecting a controllable power switch, which shows similarities to the embodiments illustrated in FIGS. 1, 3 and 4. However, the second control switch terminal 523 of the controllable control switch 519 is not directly connected to the power switch control terminal 507 of the controllable power switch 501. Instead, the second control switch terminal 523 is connected to the further gate driver input terminal 557. Only the gate driver output terminal 529 is connected via the resistor 533 to the power switch control terminal 507. Also, the embodiment 500 illustrated in FIG. 5 may be used, when the further gate driver input terminal 557 is a high impedance input terminal. With this configuration, the gate drivers sense input mechanism is required to change the gate driver output stage into on state during active clamping, because the direct clamp path into the power switch control terminal is not existing.

FIG. 6 illustrates an example of basic three phase back to back converter configuration 650 fed from a permanent magnet generator 651. The permanent magnet three phase generator (PMG) is shown as an example, and could equally be a three phase induction generator (IG), or slip ring induction generator (DFIG). Also the generator could be substituted for motor. The converter configuration 650 comprises a number of IGBTs 601 which may all be protected from over-voltage using a circuit according to FIG. 1, FIG. 3, FIG. 4, or FIG. 5.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS 101,301,401,501 Controllable power switch
103,302,402,502 First power switch terminal
105,305,405,505 Second power switch terminal
107,307,407,507 Power switch control terminal
109,309,409,509 First terminal
111,311,411,511 Second terminal
113,313,413,513 Zener-diode
115,315,415,515 First diode terminal
117,317,417,517 Second diode terminal
119,319,419,519 Controllable control switch
121,321,421,521 First control switch terminal
123,323,423,523, Second control switch terminal
125,325,425,525, Control switch control terminal
127,327,427,527, Gate driver circuit
129,329,429,529, Gate driver output terminal
131,331,431,531 Gate driver reference terminal (local GND)
133,333,433,533, Resistor
135,335,435,535, Control switch driver circuit
137,337,437,537, Control switch driver output terminal
139,339,439,539, Control switch driver input terminal
141,341, Normal diode
143,343,443,543, Resistor
245 Voltage between collector and emitter of controllable power switch
249 Off-state of the controllable power switch
251 On-state of the controllable power switch
255 Voltage peak
357,457,557 Further gate driver input terminal
359 Further controllable control switch
367 Further control switch driver output terminal

The invention claimed is:

1. A circuit for protecting a controllable power switch connected between a first terminal and a second terminal of the circuit from over-voltage applicable between the first terminal and the second terminal, the circuit comprising:
a controllable power switch comprising a first power switch terminal connected to a first terminal, a second power switch terminal connected to a second terminal, and a power switch control terminal, wherein a conducting state between the first power switch terminal and the second power switch terminal is based on a voltage applied between the power switch control terminal and the second power switch terminal;
a diode comprising a first diode terminal and a second diode terminal, the diode allowing electric current flow between the first diode terminal and the second diode terminal in a forward direction and allowing electric current flow in a reverse direction opposite to the forward direction, when a voltage applied between the second diode terminal and the first diode terminal is above a diode threshold voltage, the second diode terminal being connected to the first terminal;
a controllable control switch comprising a first control switch terminal connected to the first diode terminal, a second control switch terminal, and a control switch control terminal, wherein a conducting state between the first control switch terminal and the second control switch terminal is based on a voltage applied between the control switch control terminal and the second control switch terminal,
wherein a signal applied to the power switch control terminal is based on a signal at the second control switch terminal;
the circuit according further comprising:
a gate driver circuit comprising
a gate driver reference terminal connected to the second power switch terminal,
a gate driver input terminal and
a gate driver output terminal connected to the power switch control terminal,
wherein a signal generated at the gate driver output terminal is based on a signal applied to the gate driver input terminal; and
a control switch driver circuit comprising
a control switch driver output terminal connected to the control switch control terminal and
a control switch driver input terminal connected to the gate driver output terminal,
wherein the control switch driver circuit is adapted to generate a signal at the control switch driver output terminal based on a signal received at the control switch driver input terminal.

2. The circuit according to claim 1, wherein the second control switch terminal is electrically directly connected to the power switch control terminal.

3. The circuit according to claim 1, wherein the gate driver circuit comprises a further gate driver input terminal, wherein the signal generated at the gate driver output terminal is further based on a signal applied to the further gate driver input terminal, wherein the further gate driver input terminal is connected to the second control switch terminal.

4. The circuit according to claim 1, further comprising:
a further diode connected between the gate driver output terminal and the first terminal, wherein the further diode is connected in several different combinations in series with the controllable control switch between a resistor connected to the gate driver output terminal and a terminal of the diode.

5. The circuit according to claim 1, wherein the signal generated at the control switch driver output terminal is such that
the control switch is in an extended conducting state for a time interval between 500 ns and 30 μs after the controllable power switch has switched from the conducting state to the non-conducting state and
the control switch is in the non-conducting state after this time interval, when the controllable power switch is in the non-conducting state.

6. The circuit according to claim 1, wherein the diode is a bi-directional diode, the bi-directional diode allowing electric current flow between the first diode terminal and the second diode terminal in the forward direction, when a voltage applied between the first diode terminal and the second diode terminal is above a further diode threshold voltage.

7. The circuit according to claim 1, wherein the circuit is adapted to generate a signal at the gate driver output terminal such that the power switch is in the conducting state, when the voltage applied between the second diode terminal and the first diode terminal is above the diode threshold voltage.

8. The circuit according to claim 1, further comprising:
a current limiting resistor, connected between the gate driver output terminal and the second control switch terminal, for limiting a current flowing out of the gate driver output terminal.

9. The circuit according to claim 1, further comprising:
a resistor connected between the first diode terminal and the second terminal for protecting the controllable control switch from an over-voltage.

10. A circuit for protecting a controllable power switch connected between a first terminal and a second terminal of the circuit from over-voltage applicable between the first terminal and the second terminal, the circuit comprising:
a controllable power switch comprising a first power switch terminal connected to a first terminal, a second power switch terminal connected to a second terminal, and a power switch control terminal, wherein a conducting state between the first power switch terminal and the second power switch terminal is based on a voltage applied between the power switch control terminal and the second power switch terminal;
a diode comprising a first diode terminal and a second diode terminal, the diode allowing electric current flow between the first diode terminal and the second diode terminal in a forward direction and allowing electric current flow in a reverse direction opposite to the forward direction, when a voltage applied between the second diode terminal and the first diode terminal is above a diode threshold voltage, the second diode terminal being connected to the first terminal;
a controllable control switch comprising a first control switch terminal connected to the first diode terminal, a second control switch terminal, and a control switch control terminal, wherein a conducting state between the first control switch terminal and the second control switch terminal is based on a voltage applied between the control switch control terminal and the second control switch terminal,
wherein a signal applied to the power switch control terminal is based on a signal at the second control switch terminal
a further controllable control switch comprising a first further control switch terminal, a second further control switch terminal and a further control switch control terminal, wherein a conducting state between the first further control switch terminal and the second further control switch terminal is based on a voltage applied between the further control switch control terminal and the second further control switch terminal,
wherein the gate driver circuit has a further gate driver input terminal,
wherein the second further control switch terminal is connected to the further gate driver input terminal and
wherein the further control switch control terminal is connected to a further control switch driver output terminal of the control switch driver circuit.

11. A converter module for converting a DC voltage to an AC voltage, comprising:
a circuit for protecting a controllable power switch connected between a first terminal and a second terminal of the circuit from over-voltage applicable between the first terminal and the second terminal, the circuit comprising:
a controllable power switch comprising a first power switch terminal connected to the first terminal, a second power switch terminal connected to the second terminal, and a power switch control terminal, wherein a conducting state between the first power switch terminal and the second power switch terminal is based on a voltage applied between the power switch control terminal and the second power switch terminal;
a diode comprising a first diode terminal and a second diode terminal, the diode allowing electric current flow between the first diode terminal and the second diode terminal in a forward direction and allowing electric current flow in a reverse direction opposite to the forward direction, when a voltage applied between the second diode terminal and the first diode terminal is above a diode threshold voltage, the second diode terminal being connected to the first terminal;
a controllable control switch comprising a first control switch terminal connected to the first diode terminal, a second control switch terminal, and a control switch control terminal, wherein a conducting state between the first control switch terminal and the second control switch terminal is based on a voltage applied between the control switch control terminal and the second control switch terminal,
wherein a signal applied to the power switch control terminal is based on a signal at the second control switch terminal;
the circuit according further comprising:
a gate driver circuit comprising
a gate driver reference terminal connected to the second power switch terminal,
a gate driver input terminal and
a gate driver output terminal connected to the power switch control terminal,
wherein a signal generated at the gate driver output terminal is based on a signal applied to the gate driver input terminal; and
a control switch driver circuit comprising
a control switch driver output terminal connected to the control switch control terminal and
a control switch driver input terminal connected to the gate driver output terminal, wherein the control switch driver circuit is adapted to generate a signal at the control switch driver output terminal based on a signal received at the control switch driver input terminal.

12. A method for protecting a controllable power switch connected between a first terminal and a second terminal from over-voltage applied between the first terminal and the second terminal, the method comprising:

applying a voltage between a first terminal and a second terminal;

controlling a conducting state between a first power switch terminal of the power switch and a second power switch terminal of the power switch based on a voltage between a power switch control terminal and the second power switch terminal, wherein the first power switch terminal of the controllable power switch is connected to the first terminal and the second power switch terminal of the controllable switch is connected to the second terminal;

allowing electric current flow between a first diode terminal of a diode and a second diode terminal of the diode in a forward direction;

allowing electric current flow between the first diode terminal of the diode and the second diode terminal of the diode in a reverse direction opposite to the forward direction, when a voltage applied between the second diode terminal and the first diode terminal is above a diode threshold voltage, the second diode terminal being connected to the first terminal;

controlling a conducting state between a first control switch terminal of a controllable control switch and a second control switch terminal of the controllable control switch based on a voltage applied between a control switch control terminal of the controllable switch and the second control switch terminal, the first control switch terminal being connected to the first diode terminal;

using a gate driver circuit comprising
 a gate driver reference terminal connected to the second power switch terminal,
 a gate driver input terminal and
 a gate driver output terminal connected to the power switch control terminal,
wherein a signal generated at the gate driver output terminal is based on a signal applied to the gate driver input terminal; and using a control switch driver circuit comprising
 a control switch driver output terminal connected to the control switch control terminal and
 a control switch driver input terminal connected to the gate driver output terminal,
wherein a signal applied to the power switch control terminal is based on a signal at the second control switch terminal, and
wherein the control switch driver circuit is adapted to generate a signal at the control switch driver output terminal based on a signal received at the control switch driver input terminal.

* * * * *